(12) United States Patent
Abdelsalam et al.

(10) Patent No.: US 11,101,782 B1
(45) Date of Patent: Aug. 24, 2021

(54) POLYPHASE FILTER (PPF) INCLUDING RC-LR SECTIONS

(71) Applicant: Analog Devices International Unlimited Company, Limerick (IE)

(72) Inventors: Mohamed Abdelsalam, Giza (EG); Hesham Beshary, Cairo (EG); Mohamed A. Abdalla, Cairo (EG)

(73) Assignee: Analog Devices International Unlimited Company, Limerick (IE)

( * ) Notice: Subject to any disclaimer, the term of this patent is extended or adjusted under 35 U.S.C. 154(b) by 98 days.

(21) Appl. No.: 16/513,391

(22) Filed: Jul. 16, 2019

(51) Int. Cl.
*H03H 7/06* (2006.01)
*H03H 17/02* (2006.01)
*H03H 7/01* (2006.01)

(52) U.S. Cl.
CPC ............ *H03H 7/06* (2013.01); *H03H 7/0138* (2013.01); *H03H 7/17* (2013.01); *H03H 17/0273* (2013.01); *H03H 2007/0192* (2013.01)

(58) Field of Classification Search
CPC .... H03H 7/06; H03H 2007/0192; H03H 7/17; H03H 17/0273; H03H 7/0138
USPC ......................................................... 333/172
See application file for complete search history.

(56) References Cited

U.S. PATENT DOCUMENTS

| | | | |
|---|---|---|---|
| 6,831,497 B2 | 12/2004 | Koh et al. | |
| 6,836,180 B1 | 12/2004 | Kwok | |
| 6,882,191 B2 | 4/2005 | Kwok | |
| 7,190,942 B1 | 3/2007 | Nise | |
| 7,598,815 B2 | 10/2009 | Chen et al. | |
| 7,633,358 B2 | 12/2009 | Nakasha et al. | |
| 8,412,141 B2 | 4/2013 | Savoj | |
| 8,552,782 B1 | 10/2013 | Trueheart et al. | |
| 9,077,307 B2 | 7/2015 | Reynaert et al. | |
| 9,281,888 B1 | 3/2016 | Mu | |

(Continued)

FOREIGN PATENT DOCUMENTS

| | | |
|---|---|---|
| CN | 103746670 A | 4/2014 |
| CN | 107834998 B | 9/2018 |

(Continued)

OTHER PUBLICATIONS

Kim, Ki-Jin, et al., "Millimeter Wave I/Q Generation with the Inductive Resonator Matched Poly-Phase Filter", World Academy of Science, Engineering and Technology, Intl. Journal of Electronics and Communication Engineering vol. 6, No. 10, (2012), 4 pgs.

(Continued)

*Primary Examiner* — Rakesh B Patel
(74) *Attorney, Agent, or Firm* — Schwegman Lundberg & Woessner, P.A.

(57) ABSTRACT

Polyphase filters (PPFs) can be used to generate quadrature or other phase-shifted representations of an input signal provided to the PPF. In one approach, a "passive" polyphase filter can include a combination of resistive and capacitive elements. Such a topology can be referred to as an RC-PPF topology. Another passive circuit topology can be used to provide a PPF, by replacing the resistive elements with inductive elements, and by replacing the capacitive elements with resistive elements. A filter circuit can include cascaded RC-PPF and LR-PPF sections, such as in an alternating manner (e.g., an "RC-LR" topology). In this approach, a total insertion loss of cascaded LR-PPF and RC-PPF sections can be reduced as compared to using LR-PPF or RC-PPF sections, alone.

20 Claims, 8 Drawing Sheets

(56) References Cited

U.S. PATENT DOCUMENTS

| | | |
|---|---|---|
| 9,479,105 B2 | 10/2016 | Rozman et al. |
| 9,941,908 B2 | 4/2018 | Bauder |
| 2002/0063606 A1 | 5/2002 | Van Zeijl |

FOREIGN PATENT DOCUMENTS

| | | |
|---|---|---|
| GB | 2361123 A | 10/2001 |
| WO | WO-2018229977 A1 | 12/2018 |

OTHER PUBLICATIONS

Meng, Chinchun, et al., "Gilbert Mixers With Microwave Quadrature/Differential Generators: An Approach for Millimeter-Wave IC", IEEE Radio and Wireless Symposium, (Jan. 2009), 4 pgs.

Park, Bonghyuk, et al., "A 3.1 to 5 GHz CMOS Transceiver for DS-UWB Systems", ETRI Journal, vol. 29, No. 4, (Aug. 2007), 9 pgs.

Sah, Suman P., et al., "Design and Analysis of a Wideband 15-35-GHz Quadrature Phase Shifter With Inductive Loading", IEEE Transactions on Microwave Theory and Technique, vol. 61, No. 8, (Aug. 2013), 10 pgs.

Weldon, Jeffrey A., et al., "A 1.75-GHz Highly Integrated Narrow-Band CMOS Transmitter With Harmonic-Rejection Mixers", IEEE Journal of Solid-State Circuits, vol. 36, No. 12, (Dec. 2001), 13 pgs.

Zhang, Tao, et al., "Integrated K-Band CMOS Passive Mixers Utilizing Balun and Polyphase Filters", IEEE Intl. Symposium on Radio-Frequency Integration Technology, (2011), 4 pgs.

POLYPHASE FILTER (PPF) INCLUDING RC-LR SECTIONS

FIELD OF THE DISCLOSURE

This document pertains generally, but not by way of limitation, to apparatus and techniques that can be used for processing electrical signals in the analog domain, and more particularly, to one or more of filtering or phase-shifting electrical signals using a filter circuit comprising cascaded filter sections.

BACKGROUND

Electronic circuits, such as used for communication or measurement, can include circuitry for processing signals represented by in-phase (I) and quadrature (Q) signal components. Various techniques can be used to synthesize or process such "quadrature" signals (where the phrase "quadrature signals" refers generally to both the in-phase and the quadrature signal components as constituents). For example, in a communication circuit such as a wireless networking, cellular communication, satellite, or other radio communication application, radio frequency, microwave, or millimeter-wave signals may be received or transmitted by an antenna or other structure. A received signal is generally coupled to a "front end" signal processing circuit that can be used to one or more of amplify, down-convert, or filter such a received signal. Similarly, a signal to be transmitted can be one or more of amplified, up-converted, or filtered.

Frequency conversion for either receiving or transmitting signals can be performed using a mixer, which receives a representation of the received signal along with a local oscillator (LO) signal. The LO signal provided to the mixer can include in-phase and quadrature signal components representative of the specified LO frequency, to establish a desired sum or difference between the LO center frequency and the input signal undergoing frequency conversion along with providing in-phase and quadrature components of the frequency-converted input signal. For example, transmit or receive schemes involving vector modulation (e.g., "I/Q" modulation) generally involve use of phase shifters or other circuitry operating to generate or otherwise process quadrature signals. In one approach, a polyphase filter (PPF) can be used to generate quadrature signals, such as when coupled to an oscillator (e.g., an LO or synthesizer). A PPF circuit can also be used to generate other specified phase shifts, such as for signal detection or synthesis.

SUMMARY OF THE DISCLOSURE

As mentioned above, polyphase filters (PPFs) can be used to generate quadrature or other phase-shifted representations of an input signal provided to the PPF. In one approach, a "passive" polyphase filter can include a combination of resistive and capacitive elements. Such a topology can be referred to as an RC-PPF topology. To achieve a desired bandwidth, multiple RC-PPF sections can be cascaded (e.g., an "RC-RC" topology), such as implemented on or within an integrated circuit device (e.g., a monolithic integrated circuit) or package. Use of a cascaded approach can reduce or suppress one or more of gain mismatch or phase mismatch between output signals provided by the RC-PPF sections over a wider frequency range as compared to other approaches. The present inventors have recognized, among other things, that use of such an RC-PPF topology, alone, can present challenges. For example, if such passive RC-PPFs are implemented in cascaded sections, each section can contribute about −3 decibels (−3 dB) of insertion loss per section, corresponding to a loss of 50% of the input signal amplitude per section.

The present inventors have also recognized that another passive circuit topology can be used to provide a PPF, by replacing the resistive elements with inductive elements, and by replacing the capacitive elements with resistive elements. Such a topology can represent a "dual" of the RC-PPF topology and can be referred to as an LR-PPF topology. Use of LR-PPF structure, alone, can also present challenges. As in the RC-PPF example, in a cascaded (e.g., "LR-LR") topology, each LR-PPF section can create a −3 dB loss when LR-PPF sections are cascaded. Depending on a frequency range of interest, achieving a desired inductance for the inductive elements may also consume significant integrated circuit area.

The present inventors have recognized, among other things, that such challenges can be addressed at least in part by cascading RC-PPF and LR-PPF and sections, such as in an alternating manner (e.g., an "RC-LR" topology). In this approach, a total insertion loss of cascaded LR-PPF and RC-PPF sections can be reduced as compared to using LR-PPF or RC-PPF sections, alone.

In an example, subject matter described in this document can include an electronic circuit defining an analog filter circuit, the electronic circuit comprising at least two cascaded polyphase filter sections, the at least two cascaded polyphase filter sections comprising a first polyphase filter section type including resistive elements and first reactive elements comprising a first type of reactive device, and a second polyphase filter section type electrically coupled in series with the first polyphase filter section type, the second polyphase filter type including resistive elements and second reactive elements comprising a different second type of reactive device. The electronic circuit can include an input port coupled to the at least two cascaded polyphase filter sections and at least two output ports coupled to the at least two cascaded polyphase filter sections, where the at least two cascaded polyphase filter sections are arranged to provide, at the at least two output ports, respective phase-shifted representations of an input signal provided to the input port.

In an example, an electronic circuit can provide phase-shifted representations of an input signal, the electronic circuit comprising a filter circuit comprising cascaded polyphase filter sections including alternating serially-coupled sections comprising a first polyphase filter section type and a second polyphase filter section type, the first polyphase filter section type comprising first reactive elements comprising a first type of reactive device, and the second polyphase filter section type comprising second reactive elements comprising a different second type of reactive device, and a signal source coupled to an input port of the filter circuit, where the filter circuit defines at least two output ports to provide respective phase-shifted representations of a signal generated by the signal source. The cascaded polyphase filter sections and the signal source can be co-integrated within a commonly-shared integrated circuit package.

In an example, a technique, such as a method, can include providing phase-shifted representations of an input signal, the method comprising receiving an input signal at an input port defined by a filter circuit, and generating phase-shifted representations of the input signal using the filter circuit, wherein the filter circuit comprises cascaded polyphase filter sections including alternating serially-coupled sections comprising a first polyphase filter section type and the second polyphase filter section type, the first polyphase filter section type comprising first reactive elements comprising a first type of reactive device, and the second polyphase filter section type comprising second reactive elements comprising a different second type of reactive device.

Generally, the examples described in this document can be implemented in whole or in part within an integrated circuit package or module, such as monolithically integrated.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Analog filter circuits can be used to provide a polyphase filter (PPF) topology. In such a topology, an input signal can be received by a filter circuit, and outputs can be generated such as including phase-shifted representations of the input signal. The filter circuit can be included, such as in a communication circuit to provide phase-shifted representations of an oscillator signal. Such phase-shifted representations can be used as local oscillator (LO) input signals to mixers for use in a vector modulator or vector demodulator, as illustrative examples.

Figure 1A:
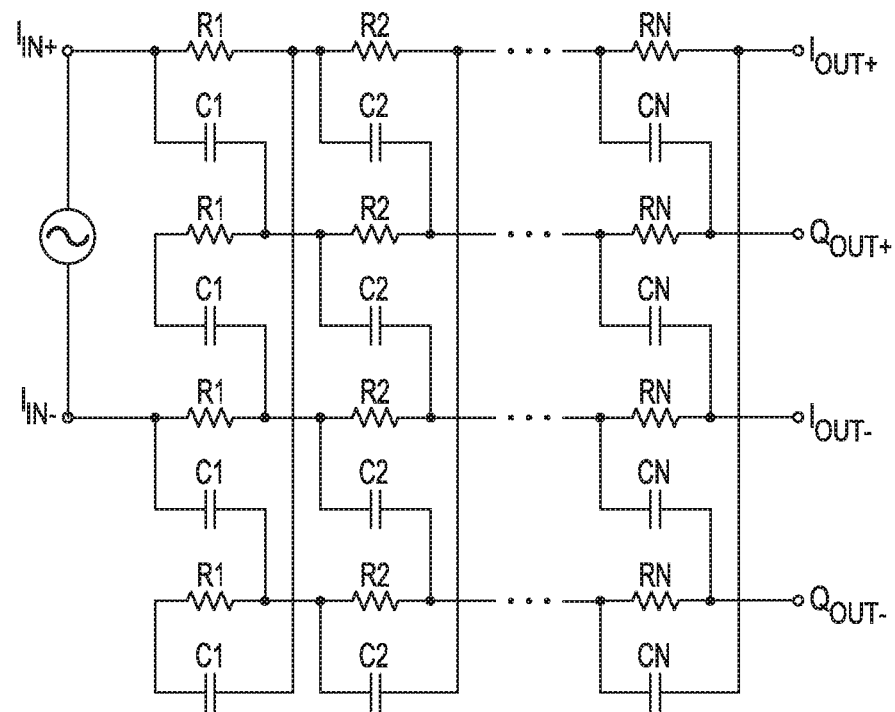
FIG. 1A illustrates generally an example comprising a polyphase filter (PPF) circuit comprising RC-PPF sections.
Figure 1B:
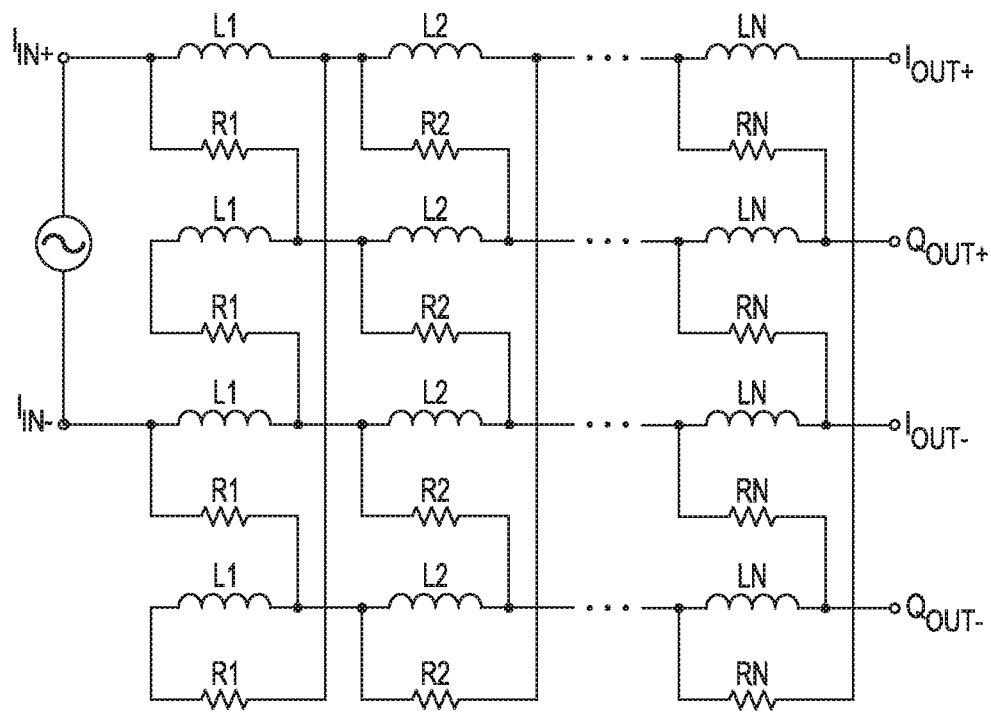
FIG. 1B illustrates generally an example comprising a polyphase filter (PPF) circuit comprising LR-PPF sections.

In one approach, a PPF topology can include a filter section comprising a combination of resistive elements and capacitive elements (e.g., an RC-PPF topology as mentioned above), as shown illustratively in FIG. 1A, which illustrates generally an example comprising a polyphase filter (PPF) circuit comprising RC-PPF sections, exclusively. In another approach, a PPF topology can include a filter section comprising a combination of inductive elements and resistive elements (e.g., an LR-PPF topology as mentioned above), as shown illustratively in FIG. 1B, which illustrates generally an example comprising a polyphase filter (PPF) circuit comprising LR-PPF sections, exclusively. As shown in FIG. 1A and FIG. 1B, PPFs can include multiple "stages" or filter sections.

Generally, as mentioned elsewhere herein, multi-stage or multi-section filter topologies can provide enhanced wide band performance as compared to other approaches. Generally, in a PPF filter using exclusively capacitive devices as the reactive elements, or exclusively using inductive devices as the reactive elements, an insertion loss of −3 dB per section is incurred. The present inventors have recognized, among other things, that cascading filter sections comprising two different PPF filter section types can provide insertion loss performance that is improved (e.g., lower loss) than a corresponding filter topology using only one of the two PPF filter section types.

Figure 2:
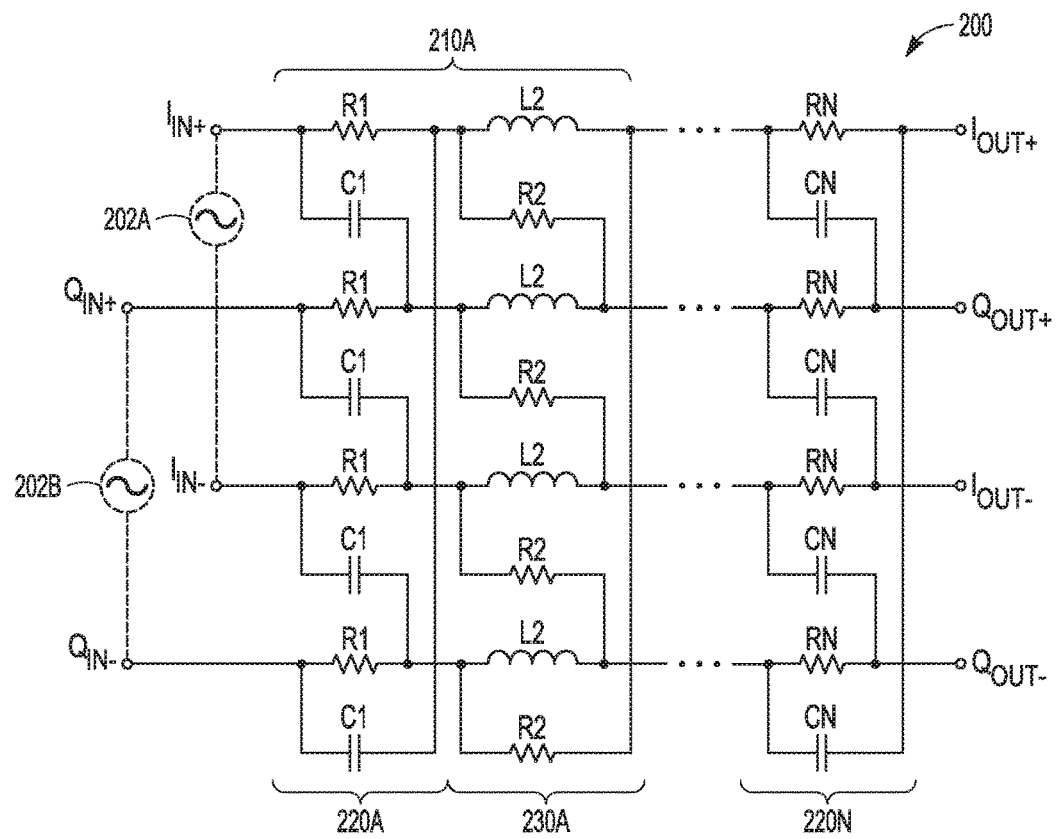
FIG. 2 illustrates generally an example comprising a polyphase filter (PPF) circuit comprising at least one LR-PPF section and at least one RC-PPF section.

FIG. 2 illustrates generally an example comprising a polyphase filter (PPF) circuit 200 comprising at least one LR-PPF section 230A and at least one RC-PPF section 220A (such as arranged in an alternating progression, as shown illustratively by the pair 210A). Generally, a PPF circuit, such as the filter circuit 200 of FIG. 2, can include cascaded (e.g., serially-connected) filter sections, such as a count of "N" sections comprising alternating RC-PPF and LR-PPF section types. For example, as shown illustratively in FIG. 2, a first polyphase filter section type (e.g., the RC-PPF section 220A) can include resistive elements (R1) and reactive elements comprising a first type of reactive device (e.g., capacitors C1). A second polyphase filter section type (e.g., the LR-PPF section 230A) can include resistive elements (R2) and reactive elements comprising a second type of reactive device (e.g., inductors L2). In FIG. 2, an alternating pair 210A is shown as the first filter sections in the circuit 200. Such an example is illustrative and other configurations can be used. For example, an alternating pair 210A can be located elsewhere along the circuit 200, such as before or after one or more non-alternating filter sections.

The filter circuit 200 can define at least one input port, such as a differential input port comprising nodes $I_{IN+}$ and $I_{IN-}$. A signal source such as an alternating current source 202A can be coupled to the input port to provide an input signal to the filter circuit 200. The AC source 202A can represent an oscillator circuit, such as a local oscillator (LO) in a communication circuit or another source such as provided by a radio frequency (RF), microwave, or millimeter wave circuit. In the illustrative example of FIG. 2, differential quadrature input ports can be used, such as a first port defined by nodes $I_{IN+}$ and $I_{IN-}$, and a second port defined by nodes $Q_{IN+}$ and $Q_{IN-}$, supplied by a second alternating current source 202B. Generally, $Q_{IN+}$ and $Q_{IN-}$ are quadrature components of an input signal that are phase shifted plus-or-minus 90 degrees with respect to $I_{IN+}$, as an illustrative example. If only $I_{IN+}$ and $I_{IN-}$ are used, then the nodes $Q_{IN+}$ and $Q_{IN-}$ can be connected to a reference node (e.g., "grounded"), or, in another approach, $Q_{IN+}$ and $Q_{IN-}$ can be connected to $I_{IN+}$ and $I_{IN-}$.

The filter circuit 200 can include at least two output ports. For example, the filter circuit 200 shown in FIG. 2 terminates with a final or "Nth" filter section 220N, defining two differential output ports. The two differential output ports include a first differential output port defined by the nodes $I_{OUT+}$ and $I_{OUT-}$, and a second differential output port defined by the nodes $Q_{OUT+}$ and $Q_{OUT-}$. The node $I_{OUT+}$ can provide a representation of the input signal provided to the input port, phase shifted (e.g., phase rotated) or delayed by the circuit 200, the node $I_{OUT-}$ can provide a 180-degree phase-shifted representation of the signal provided at $I_{OUT+}$, the node $Q_{OUT+}$ can provide a 90-degree phase-shifted representation of the signal at $I_{OUT+}$, and the node $Q_{OUT-}$ can provide a minus-ninety degree or 270-degree phase-shifted representation of signal at $I_{OUT+}$. As an illustrative example, the AC source 202 can include a tunable frequency synthesizer (e.g., a digitally-controlled oscillator or synthesizer) or an output from another circuit, and the outputs of the filter circuit 200 can be coupled to respective mixer circuits to provide up-conversion or down-conversion of other signals.

Generally, the pole locations established by each PPF section can be at the same frequency, or such frequencies can be staggered (e.g., where each section includes a gain/phase mismatch pole at a specified frequency where not all frequencies match). In this manner, the filter circuit 200 can be tuned in a desired manner. The elements comprising the filter circuit 200 can be co-integrated on or within a commonly-shared integrated circuit, such as on or within a monolithic integrated circuit. Inductive elements can include planar or multi-layer inductor structures, or transmission line segments, as illustrative examples. Use of cascaded filter sections providing alternating PPF filter section types can provide enhanced insertion loss performance, as shown illustratively below in the examples of FIG. 4B and FIG. 4C (corresponding to a two-section filter topology, as an illustrative example), and FIG. 6B and FIG. 6C (corresponding to a four-section filter topology, as an illustratively example).

Figure 3A:
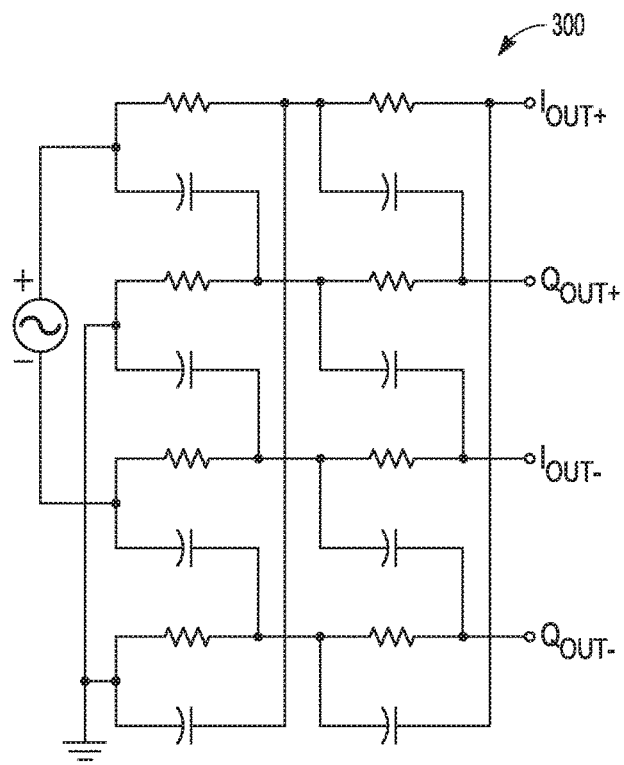
FIG. 3A illustrates generally an illustrative example of a two-stage RC-RC cascaded PPF topology as simulated in FIG. 3B and FIG. 3C.
Figure 3B:
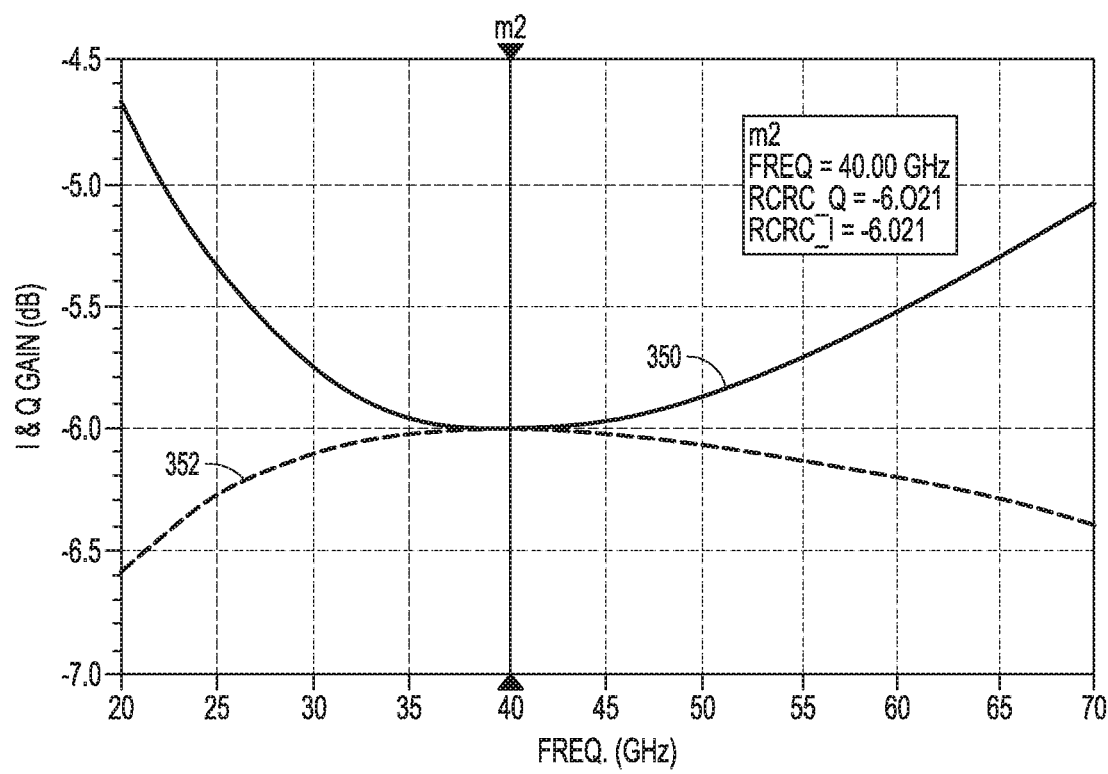
FIG. 3B illustrates generally an illustrative example comprising a simulation of in-phase (I) and quadrature (Q) output gains of a two-stage RC-RC cascaded PPF topology.
Figure 3C:
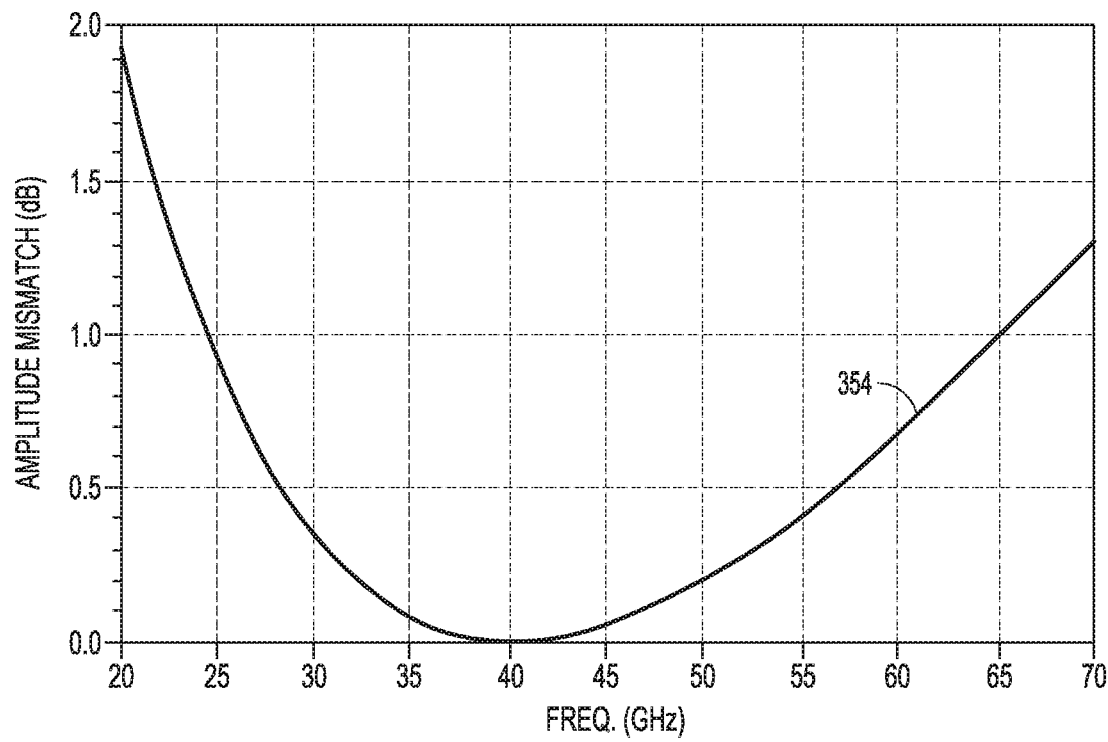
FIG. 3C illustrates generally an illustrative example comprising a simulation of a mismatch between in-phase (I) and quadrature (Q) output gains of a two-stage RC-RC cascaded PPF topology.

FIG. 3A illustrates generally an illustrative example of a two-stage RC-RC cascaded PPF topology as simulated in FIG. 3B and FIG. 3C, with such simulations corresponding to an open-circuit load condition.

FIG. 3B illustrates generally an illustrative example comprising a simulation of in-phase (I) 350 and quadrature (Q) 352 output gains of a two-stage RC-RC cascaded PPF topology. The phrase "gain" refers to a difference between an output signal amplitude and the input signal amplitude (e.g., a magnitude of a voltage transfer function value evaluated with respect to frequency). Such an example corresponds to a polyphase filter circuit having two cascaded sections similar to the sections of the first type 220A shown in FIG. 2. At a specified frequency of interest, such as 40 GHz in this illustrative example, amplitude mismatch is minimized, and insertion loss is −6 dB, corresponding to −3 dB per section. FIG. 3C illustrates generally an illustrative example comprising a simulation of a mismatch 354 between in-phase (I) and quadrature (Q) output gains of a two-stage RC-RC cascaded PPF topology, corresponding to the gain responses shown in FIG. 3B.

Figure 4A:
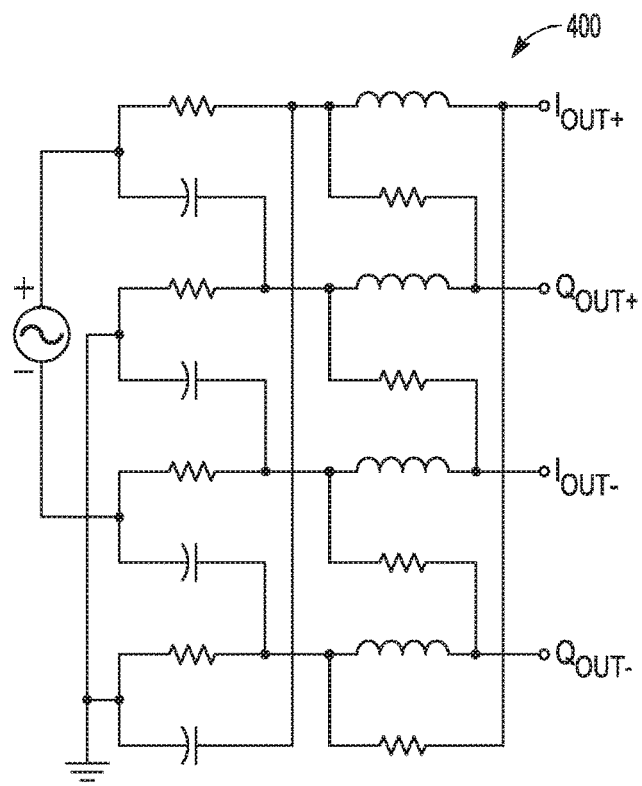
FIG. 4A illustrates generally an illustrative example of a two-stage RC-LR cascaded PPF topology as simulated in FIG. 4B and FIG. 4C.
Figure 4B:
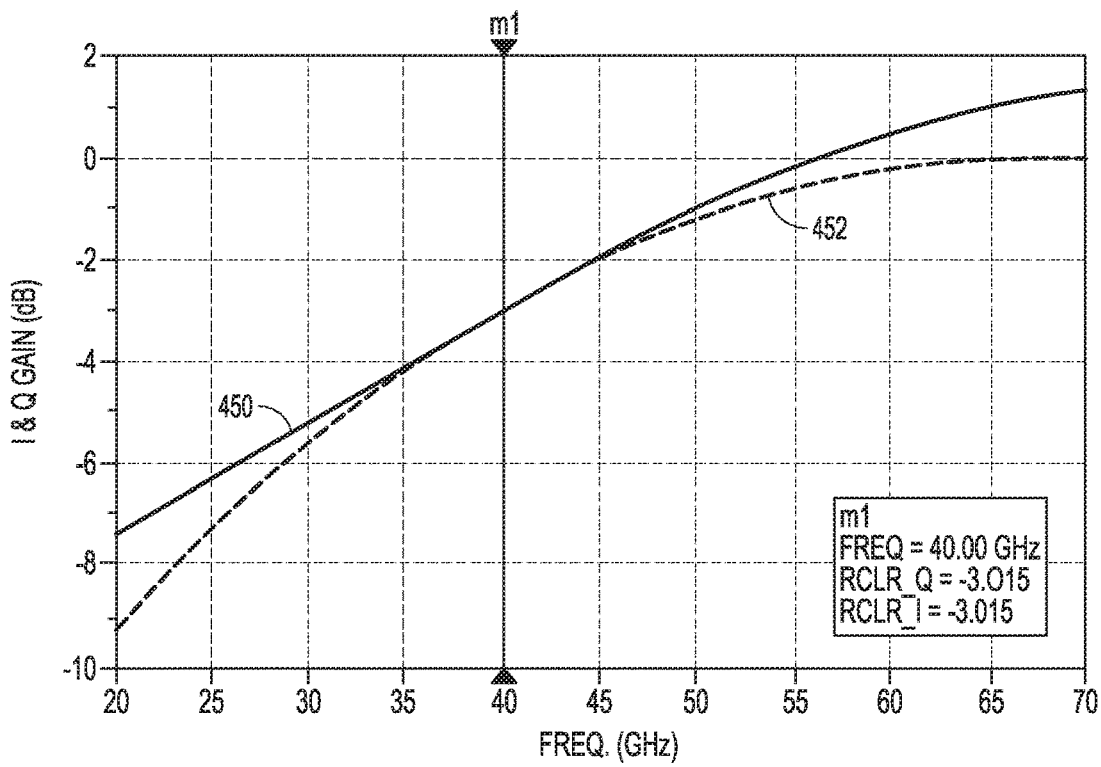
FIG. 4B illustrates generally an illustrative example comprising a simulation of in-phase (I) and quadrature (Q) output gains of a two-stage RC-LR cascaded PPF topology.
Figure 4C:
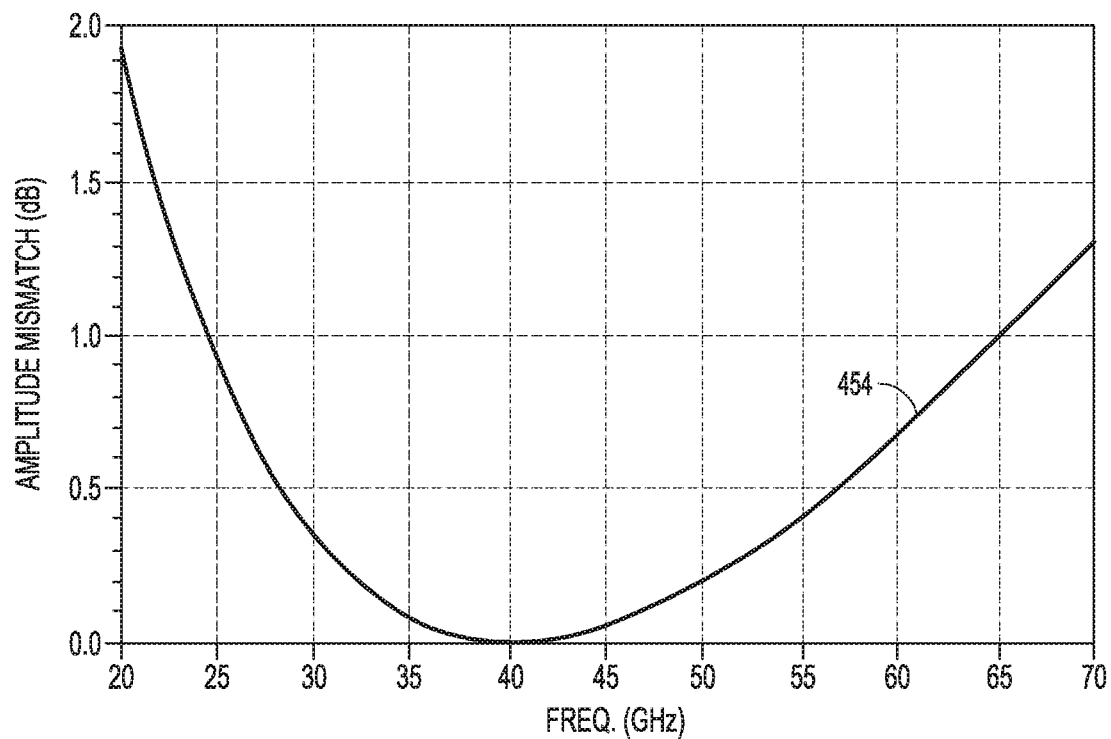
FIG. 4C illustrates generally an illustrative example comprising a simulation of a mismatch between in-phase (I) and quadrature (Q) output gains of a two-stage RC-LR cascaded PPF topology.

FIG. 4A illustrates generally an illustrative example of a two-stage RC-LR cascaded PPF topology as simulated in FIG. 4B and FIG. 4C, with such simulations corresponding to an open-circuit load condition.

By contrast with FIG. 3B, FIG. 4B illustrates generally an illustrative example comprising a simulation of in-phase (I) and quadrature (Q) output gains of a two-stage RC-LR cascaded PPF topology. The polyphase filter topology simulated in FIG. 4B and FIG. 4C includes a section of the first 220A shown in FIG. 2, and a section of the second type 230A shown in FIG. 2, cascaded in series. At a specified frequency of interest (again 40 GHz in this illustrative example), gain mismatch between in-phase and quadrature outputs is minimized, and the insertion loss is −3 dB, providing a 3 dB improvement over the topology simulated in FIG. 3B. FIG. 4C illustrates generally an illustrative example comprising a simulation of a mismatch 454 between in-phase (I) and quadrature (Q) output gains of a two-stage RC-LR cascaded PPF topology.

Figure 5A:
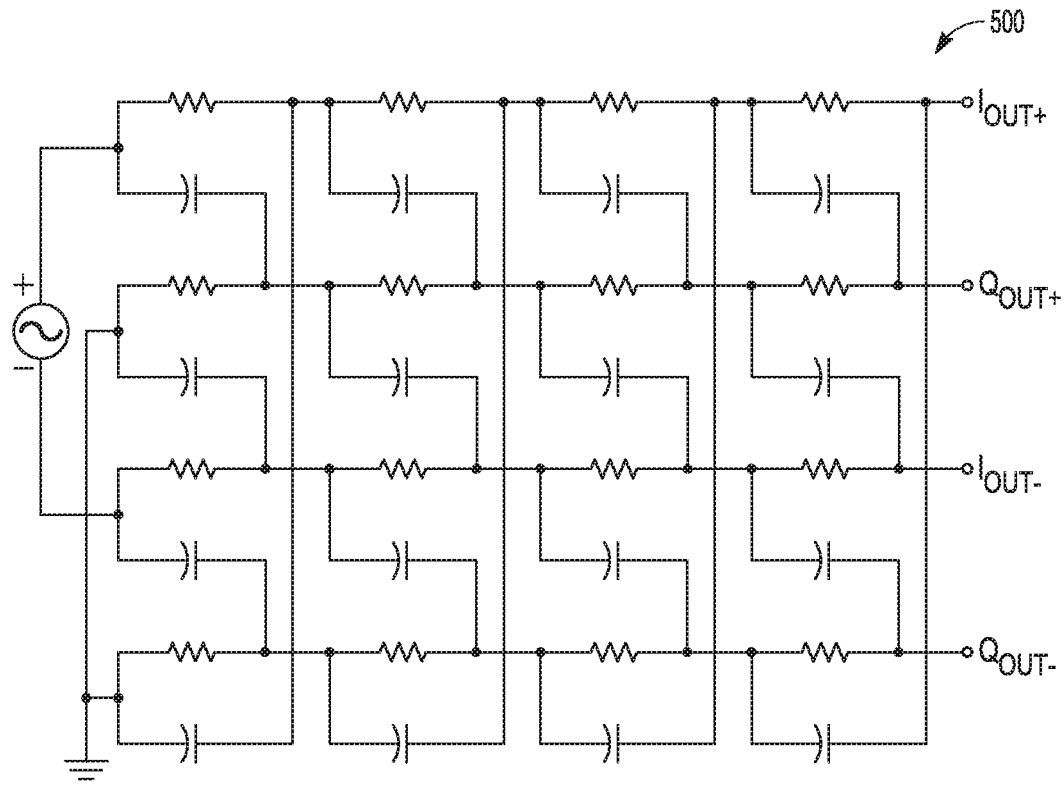
FIG. 5A illustrates generally an illustrative example of a four-stage RC-RC-RC-RC cascaded PPF topology as simulated in FIG. 5B and FIG. 5C.
Figure 5B:
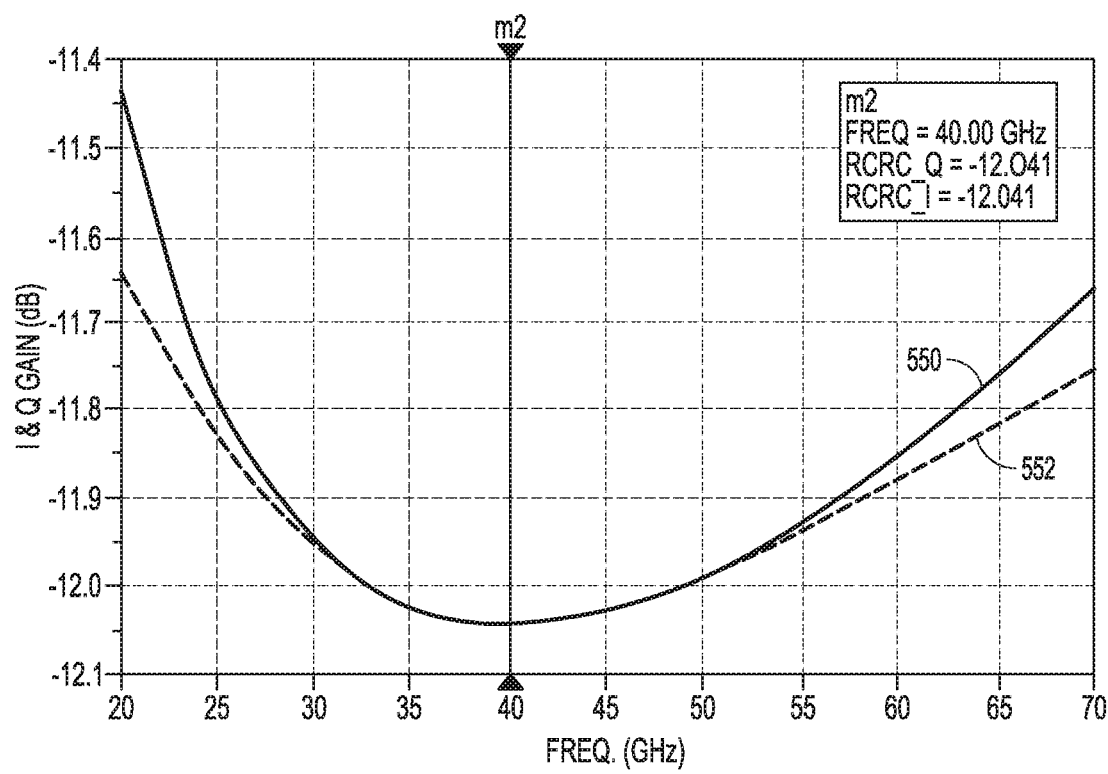
FIG. 5B illustrates generally an illustrative example comprising a simulation of in-phase (I) and quadrature (Q) output gains of a four-stage RC-RC-RC-RC cascaded PPF topology.
Figure 5C:
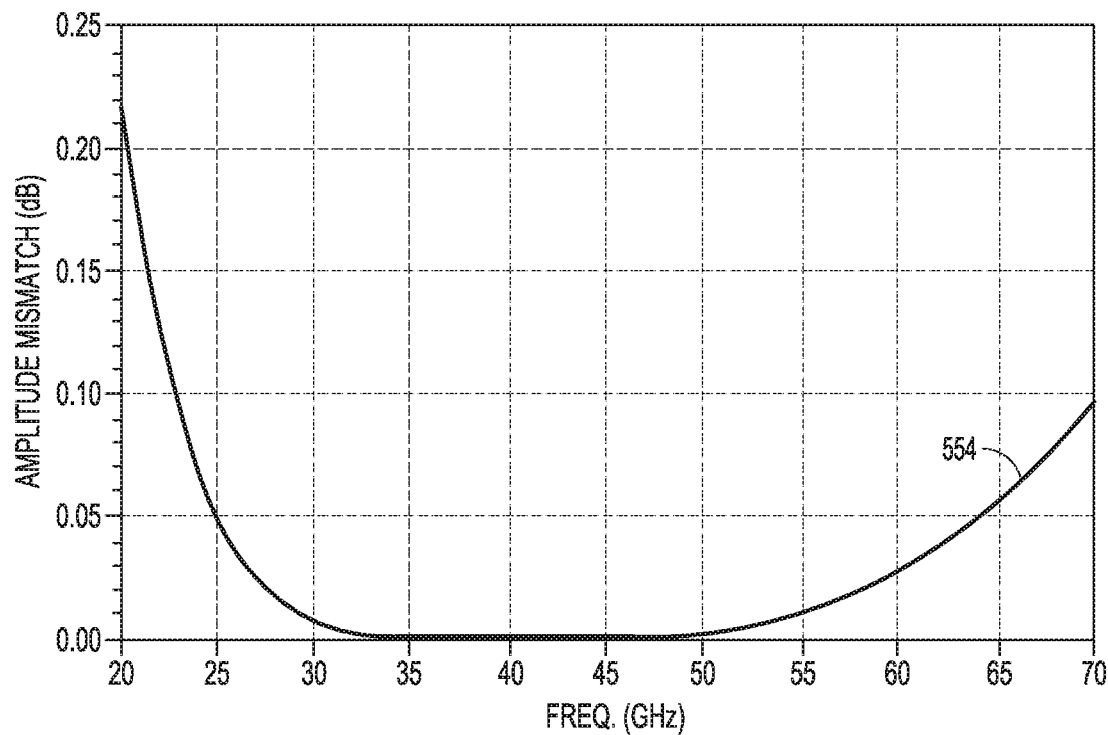
FIG. 5C illustrates generally an illustrative example comprising a simulation of a mismatch between in-phase (I) and quadrature (Q) output gains of a four-stage RC-RC-RC-RC cascaded PPF topology.

FIG. 5A illustrates generally an illustrative example of a four-stage RC-RC-RC-RC cascaded PPF topology as simulated in FIG. 5B and FIG. 5C, with such simulations corresponding to an open-circuit load condition.

As another illustrative example, FIG. 5B illustrates generally an illustrative example comprising a simulation of in-phase (1) 550 and quadrature (Q) 552 output gains of a four-stage RC-RC-RC-RC cascaded PPF topology. Such an example corresponds to a polyphase filter circuit having four cascaded sections similar to the sections of the first type 220A shown in FIG. 2. FIG. 5C illustrates generally an illustrative example comprising a simulation of a mismatch 554 between in-phase (I) and quadrature (Q) output gains of a four-stage RC-RC-RC-RC cascaded PPF topology. As can be seen from FIG. 5C, at a specified frequency of interest (e.g., 40 GHz), a mismatch between the in-phase and quadrature outputs is minimized, corresponding to an insertion loss of −12 dB as shown in FIG. 5B. When all sections are the same PPF type (e.g., all RC-PPF as in this example), use of additional sections can enhance a usable bandwidth of the PPF circuit, but at a cost of increased insertion loss. Such enhanced bandwidth can be represented by a wider range of frequencies where the amplitude mismatch 554 remains below a specified threshold (such as 0.1 dB, for example). Generally, as shown in FIG. 5C, the bandwidth below a specified threshold is much wider than in FIG. 3C corresponding to the mismatch 354 of a two-section topology.

Figure 6A:
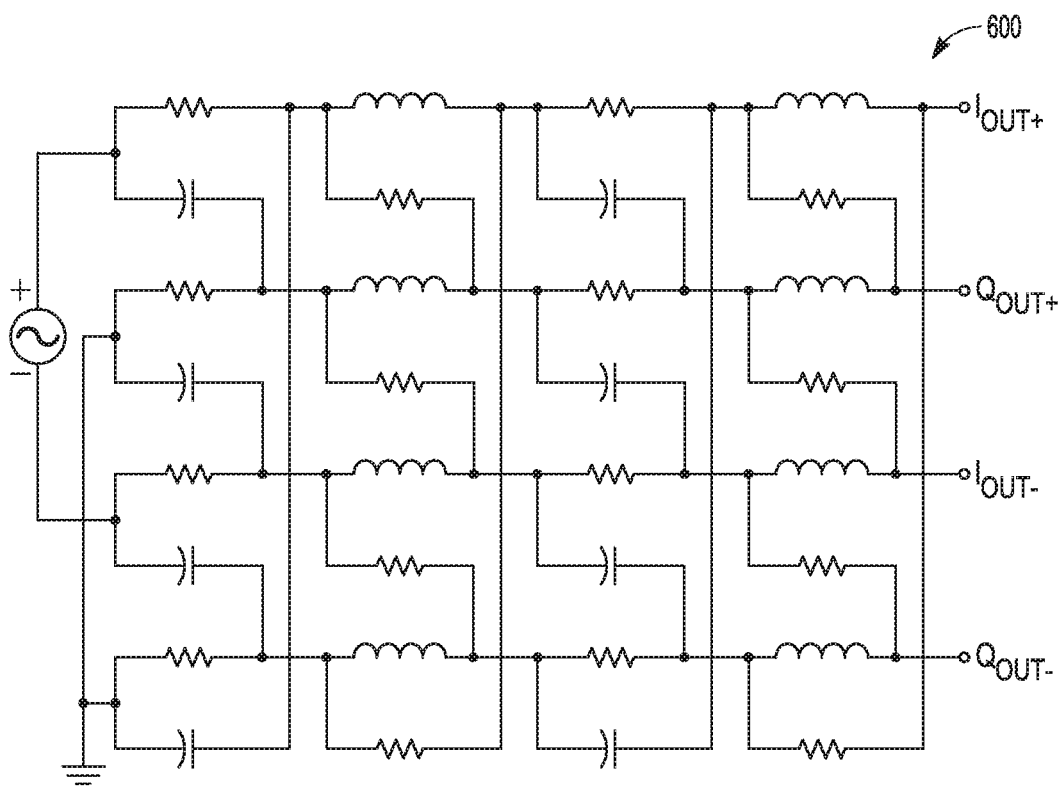
FIG. 6A illustrates generally a four-stage RC-LR-RC-LR cascaded PPF topology as simulated in FIG. 6B and FIG. 6C.
Figure 6B:
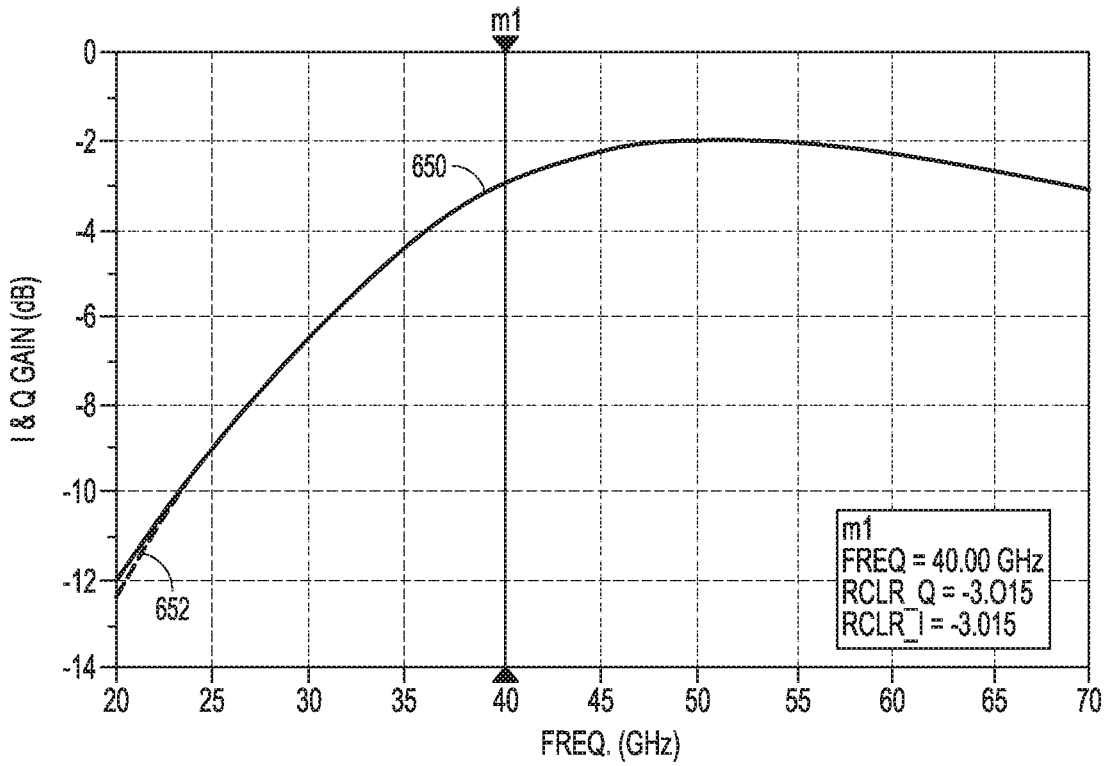
FIG. 6B illustrates generally an illustrative example comprising a simulation of in-phase (I) and quadrature (Q) output gains of a four-stage RC-LR-RC-LR cascaded PPF topology.
Figure 6C:
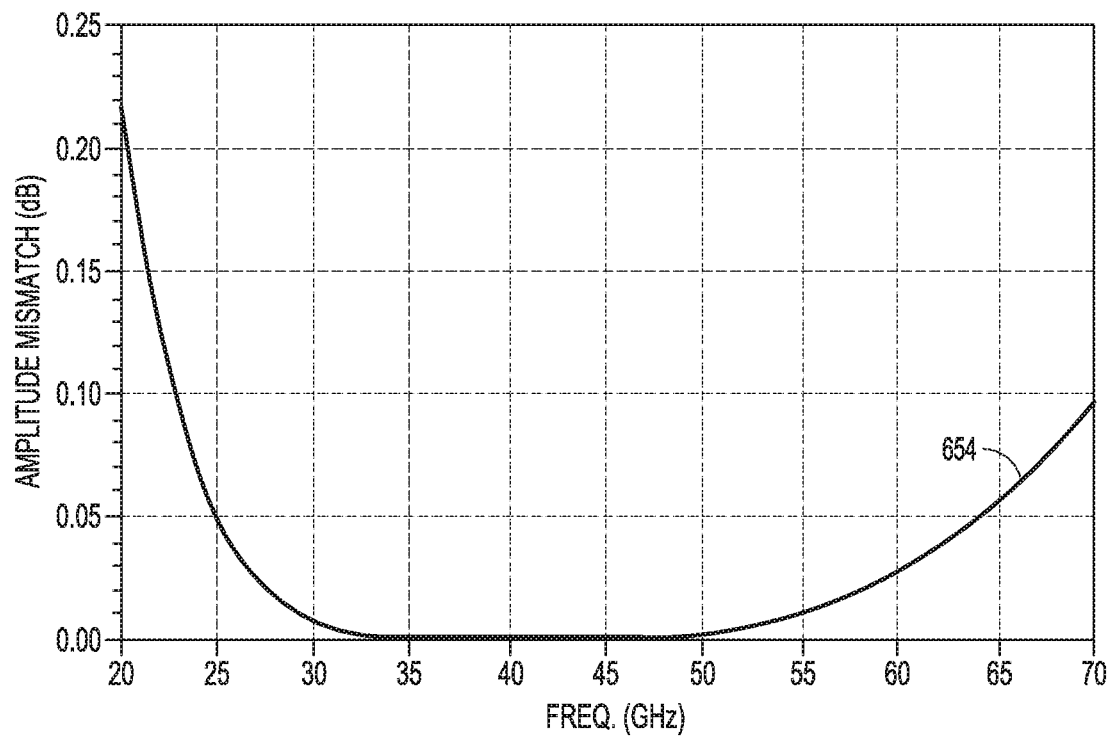
FIG. 6C illustrates generally an illustrative example comprising a simulation of a mismatch between in-phase (I) and quadrature (Q) output gains of a four-stage RC-LR-RC-LR cascaded PPF topology.

FIG. 6A illustrates generally a four-stage RC-LR-RC-LR cascaded PPF topology as simulated in FIG. 6B and FIG. 6C, with such simulations corresponding to an open-circuit load condition.

FIG. 6B illustrates generally an illustrative example comprising a simulation of in-phase (I) 650 and quadrature (Q) 652 output gains of a four-stage RC-LR-RC-LR cascaded PPF topology, where the RC-PPF sections can have a topology similar to the first PPF type 220A shown in FIG. 2, and the LR-PPF sections can have a topology similar to the second PPF type 230A shown in FIG. 2. FIG. 6C illustrates generally an illustrative example comprising a simulation of a mismatch 654 between in-phase (I) and quadrature (Q) output gains of a four-stage RC-LR-RC-LR cascaded PPF topology.

As shown in FIG. 6B and FIG. 6C, use of alternating PPF section types in a cascaded PPF topology can provide enhanced bandwidth, but with improved insertion loss performance as compared to the example of FIG. 5B where all sections are defined by the same PPF type. In FIG. 6B, the insertion loss where the mismatch is minimized is −3 dB, but bandwidth has been widened compared to the two-section examples, as shown by the mismatch 654 plot of FIG. 6C in comparison to either FIG. 3C or FIG. 4C.

Figure 7:
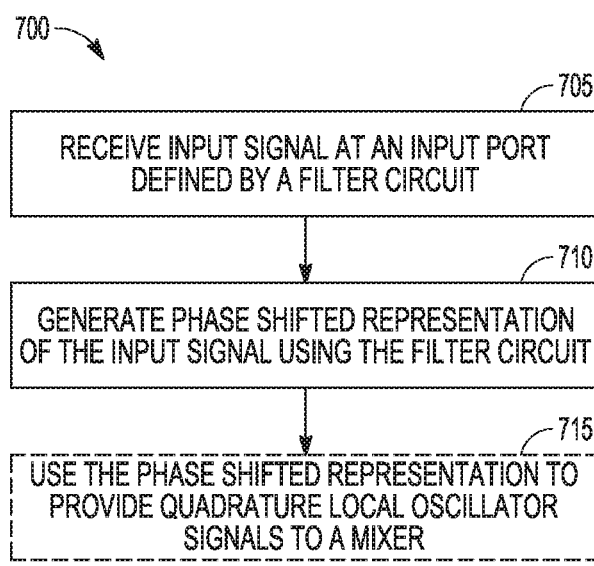
FIG. 7 illustrates generally a technique, such as a method, comprising receiving an input signal at an input port defined by a filter circuit and generating phase shifted representations of the input signal using the filter circuit.

FIG. 7 illustrates generally a technique 700, such as a method, comprising receiving an input signal at an input port defined by a filter circuit at 705 and at 710, generating phase shifted representations of the input signal using the filter circuit. The filter circuit can include a multi-section polyphase filter (PPF), such as cascaded polyphase filter sections including alternating serially-coupled sections comprising a first polyphase filter section type and the second polyphase filter section type, the first polyphase filter section type comprising first reactive elements comprising a first type of reactive device, and the second polyphase filter section type comprising second reactive elements comprising a different second type of reactive device. The first reactive elements can include capacitors and the second reactive elements can include inductors (or vice versa).

The input signal can be generated by an AC source coupled to the input port, such as an AC source comprising a tunable local oscillator or other circuit (e.g., a tunable or fixed-frequency oscillator or synthesizer), or an output from another circuit. Optionally, at 715, phase shifted representations of the input signal provided by the filter circuit can be used such as inputs to a mixer circuit to provide up-conversion or down-conversion of quadrature signals (e.g., including in-phase and quadrature signal components). For example, the outputs of the filter circuit can include a first differential representation of the input signal, and a quadrature differential representation of the input signal that is phase shifted by a specified degree relative to the first differential representation. The in-phase differential representation can be provided to an in-phase LO input of a mixer, and the quadrature differential representation can be provided to a quadrature input of the mixer.

Each of the non-limiting aspects in this document can stand on its own or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electronic circuit defining an analog filter circuit, the electronic circuit comprising:
    at least two cascaded polyphase filter sections, the at least two cascaded polyphase filter sections comprising:
    a first polyphase filter section type including resistive elements and first reactive elements comprising a first type of reactive device; and
    a second polyphase filter section type electrically coupled in series with the first polyphase filter section type, the second polyphase filter type including resistive elements and second reactive elements comprising a different second type of reactive device;
    an input port coupled to the at least two cascaded polyphase filter sections; and
    at least two output ports coupled to the at least two cascaded polyphase filter sections, wherein the at least two cascaded polyphase filter sections are arranged to provide, at the at least two output ports, respective phase-shifted representations of an input signal provided to the input port;
    wherein the first type of reactive device or the second type of reactive device comprises a transmission line segment.

2. The electronic circuit of claim 1, wherein the first type of reactive device comprises a capacitor; and
    wherein the second type of reactive device comprises the transmission line segment.

3. The electronic circuit of claim 1, wherein the first type of reactive device comprises a transmission line segment; and
    wherein the second type of reactive device comprises a capacitor.

4. The electronic circuit of claim 1, wherein the input port is coupled to the at least two cascaded polyphase filter sections through a third filter section; and
    wherein the at least two output ports are coupled to the at least two cascaded polyphase filter sections through a fourth filter section.

5. The electronic circuit of claim 4, comprising a signal source coupled to the input port; and
    wherein the at least two output ports comprise an in-phase output, and a quadrature output that is phase-shifted 90 degrees with respect to the in-phase output.

6. The electronic circuit of claim 1, wherein the at least two output ports comprise respective differential output ports.

7. The electronic circuit of claim 6, wherein the respective differential output ports comprise:
    a first differential port having a first node to provide a first representation of the input signal and a second node to provide a 180-degree phase-shifted representation of the first representation; and
    a second differential port having a first node to provide a 90-degree phase-shifted representation of the first representation and a second node to provide 270-degree phase-shifted representation of the first representation.

8. The electronic circuit of claim 1, comprising four cascaded polyphase filter sections including alternating serially-coupled sections comprising the first polyphase filter section type and the second polyphase filter section type.

9. The electronic circuit of claim 1, wherein the transmission line segment comprises an integrated circuit transmission line segment.

10. An electronic circuit for providing phase-shifted representations of an input signal, the electronic circuit comprising:
    a filter circuit comprising cascaded polyphase filter sections including alternating serially-coupled sections comprising a first polyphase filter section type and a second polyphase filter section type, the first polyphase filter section type comprising first reactive elements comprising a first type of reactive device, and the second polyphase filter section type comprising second reactive elements comprising a different second type of reactive device; and
    a signal source coupled to an input port of the filter circuit;
    wherein the filter circuit defines at least two output ports to provide respective phase-shifted representations of a signal generated by the signal source;
    wherein the first type of reactive device or the second type of reactive device comprises a transmission line segment.

11. The electronic circuit of claim 10, wherein the first reactive elements comprise capacitors; and
    wherein the second reactive elements comprise transmission line segments.

12. The electronic circuit of claim 10, wherein the first reactive elements comprise transmission line segments; and
    wherein the second reactive elements comprise capacitors.

13. The electronic circuit of claim 11, wherein the transmission line segments comprise integrated circuit transmission line segments.

14. The electronic circuit of claim 10, wherein the cascaded polyphase filter sections and the signal source are co-integrated within a commonly-shared integrated circuit package.

15. The electronic circuit of claim 10, wherein the at least two outputs ports comprise respective differential output ports, comprising:
    a first differential output port having a first node to provide an first representation of the input signal and a second node to provide a 180-degree phase-shifted representation of the first representation; and
    a second differential output port having a first node to provide a 90-degree phase-shifter representation of the first representation and a second node to provide 270-degree phase-shifted representation of the first representation.

16. A method for providing phase-shifted representations of an input signal, comprising:
    receiving an input signal at an input port defined by a filter circuit;
    generating phase-shifted representations of the input signal using the filter circuit, wherein the filter circuit comprises cascaded polyphase filter sections including alternating serially-coupled sections comprising a first polyphase filter section type and the second polyphase filter section type, the first polyphase filter section type comprising first reactive elements comprising a first type of reactive device, and the second polyphase filter section type comprising second reactive elements comprising a different second type of reactive device;
    wherein the first type of reactive device or the second type of reactive device comprises a transmission line segment.

17. The method of claim 16, wherein the first reactive elements comprise capacitors; and
    wherein the second reactive elements comprise transmission line segments.

18. The method of claim 16, wherein the first reactive elements comprise transmission line segments; and wherein the second reactive elements comprise capacitors.

19. The method of claim 16, wherein the input signal is generated by a signal source coupled to the input port.

20. The method of claim 16, wherein the phase-shifted representations comprise a first differential representation of the input signal and a quadrature differential representation.

* * * * *

UNITED STATES PATENT AND TRADEMARK OFFICE
CERTIFICATE OF CORRECTION

PATENT NO.         : 11,101,782 B1
APPLICATION NO.    : 16/513391
DATED              : August 24, 2021
INVENTOR(S)        : Abdelsalam et al.

Page 1 of 1

It is certified that error appears in the above-identified patent and that said Letters Patent is hereby corrected as shown below:

In the Claims

In Column 9, Line 30, in Claim 3, delete "a" and insert --the-- therefor

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*